US009076501B2

(12) United States Patent
Xia et al.

(10) Patent No.: US 9,076,501 B2
(45) Date of Patent: Jul. 7, 2015

(54) APPARATUSES AND METHODS FOR REDUCING CURRENT LEAKAGE IN A MEMORY

(71) Applicant: Micron Technology, Inc., Boise, ID (US)

(72) Inventors: Zhong-yi Xia, Boise, ID (US); Scott J. Derner, Boise, ID (US); Charles L. Ingalls, Meridian, ID (US); Howard C. Kirsch, Eagle, ID (US)

(73) Assignee: Micron Technology, Inc., Boise, ID (US)

( * ) Notice: Subject to any disclaimer, the term of this patent is extended or adjusted under 35 U.S.C. 154(b) by 46 days.

(21) Appl. No.: 13/970,518

(22) Filed: Aug. 19, 2013

(65) Prior Publication Data
US 2015/0049565 A1    Feb. 19, 2015

(51) Int. Cl.
*G11C 16/28*     (2006.01)
*G11C 7/06*      (2006.01)
*G11C 7/12*      (2006.01)

(52) U.S. Cl.
CPC .. *G11C 7/06* (2013.01); *G11C 7/12* (2013.01); *G11C 16/28* (2013.01)

(58) Field of Classification Search
CPC ..... G11C 16/28; G11C 16/26; G11C 11/5642
USPC .......... 365/185.21, 196, 205, 189.05
See application file for complete search history.

(56) References Cited

U.S. PATENT DOCUMENTS

| | | | |
|---|---|---|---|
| 5,822,264 A | 10/1998 | Tomishima et al. | |
| 5,903,502 A | 5/1999 | Porter | |
| 6,081,443 A | 6/2000 | Morishita et al. | |
| 7,038,958 B2 | 5/2006 | Joo et al. | |
| 7,872,933 B2 | 1/2011 | Ohsawa | |
| 2007/0177443 A1* | 8/2007 | Ohsawa | 365/210 |
| 2008/0232182 A1 | 9/2008 | Lee et al. | |
| 2009/0109775 A1 | 4/2009 | Hwang | |

OTHER PUBLICATIONS

U.S. Appl. No. 13/560,181, filed Jan. 30, 2014.

* cited by examiner

*Primary Examiner* — Jason Lappas
(74) *Attorney, Agent, or Firm* — Dorsey & Whitney LLP (57) ABSTRACT

Apparatuses, sense amplifier circuits, and methods for operating a sense amplifier circuit in a memory are described. An example apparatus includes a sense amplifier circuit configured to be coupled to a digit line and configured to, during a memory access operation, drive the digit line to a voltage that indicates the logical value of the charge stored by a memory cell coupled to the digit line. During an initial time period of the memory access operation, the sense amplifier circuit is configured to drive the digit line to a first voltage that indicates the logical value of the charge stored by the memory cell. After the initial time period, the sense amplifier circuit is configured to drive the digit line to a second voltage different than the first voltage that indicates the logical value of the charge stored by the memory cell.

16 Claims, 6 Drawing Sheets

APPARATUSES AND METHODS FOR REDUCING CURRENT LEAKAGE IN A MEMORY

TECHNICAL FIELD

Embodiments of the invention relate generally to electronic memories, and more particularly, in one or more of the illustrated embodiments, to reducing leakage current in a memory.

DESCRIPTION OF RELATED ART

Advances in technology have resulted in high density memory architectures and increased portability of technologies including high density memory architectures. Certain memory architectures include memory cells with vertical access devices that have floating body architectures. As the potential of the bodies of the access devices fluctuate, the access devices may become susceptible to current leakage. During memory access operations, voltages along bit lines may be pulled high or low via a sense amplifier, resulting in a relatively high voltage differential across an access device of a storage element of the memory cell. As the voltage increases, the leakage current may increase. Additionally, the leakage current may further increase as the voltage differential is maintained across the access device during the memory access operation. Although reducing the voltage provided by the sense amplifier may reduce the leakage currents, reducing the leakage current by reducing voltages may cause access times to fails to meet performance specifications for the memory access operations.

DETAILED DESCRIPTION

Certain details are set forth below to provide a sufficient understanding of embodiments of the disclosure. However, it will be clear to one having skill in the art that embodiments of the disclosure may be practiced without these particular details. Moreover, the particular embodiments of the present disclosure described herein are provided by way of example and should not be used to limit the scope of the disclosure to these particular embodiments.

Figure 1:
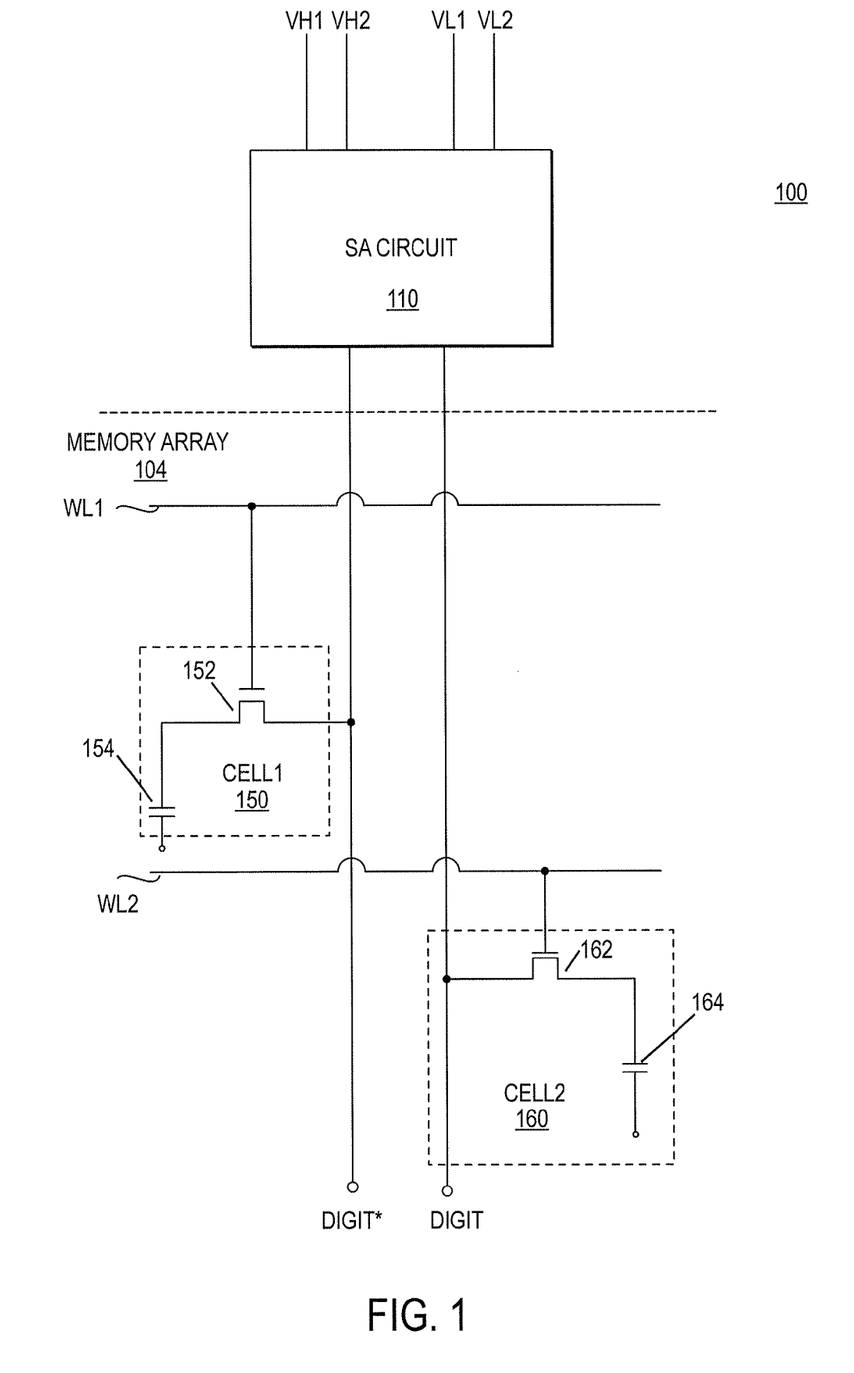
FIG. 1 is a block diagram of a particular illustrative embodiment of an apparatus including a sense amplifier circuit according to an embodiment of the disclosure.

Referring to FIG. 1, a particular illustrative embodiment of an apparatus including a sense amplifier circuit according to an embodiment of the invention is disclosed and generally designated 100. The apparatus 100 may be an integrated circuit, a memory device, a memory system, an electronic device or system, a smart phone, a tablet, a computer, a server, etc. The apparatus 100 may include a sense amplifier circuit 110 that is coupled to a first memory cell 150 of a memory array 104 via a first digit line DIGIT*. The sense amplifier circuit 110 is also coupled to a second memory cell 160 via a second digit line DIGIT of the memory array 104. The memory array 104 may include memory cells in addition to the first and second memory cells 150 and 160 illustrated in FIG. 1. Also, additional memory cells may be coupled to the DIGIT* line and additional memory cells may be coupled to the DIGIT line.

The first memory cell 150 may include a first access device 152 coupled to a first storage device 154. The gate of the first access device 152 may be coupled to a first wordline WL1. The second memory cell 160 may include a second access device 162 coupled to a second storage device 164. The first memory cell 150 and the second memory cell 160 may include circuits having floating body architectures, which may have body substrates that are not electrically connected. For example, the first access device 152 and the second access device 162 may be vertical channel transistors. The first memory cell 150 and the second memory cell 160 may also include circuits having silicon-on-insulator (SOI) architecture, or other floating body substrate architectures. As known, circuits having floating body architectures may be subject to a floating body effect (FBE) due to the floating potential of the substrate body. FBE may cause uncontrolled device parameter variations depending, for example, on terminal voltages and operation history. Circuit degradation due to FBE may result in undesirable circuit performance.

The gate of the second access device 162 may be coupled to a second wordline WL2. In some embodiments, the first access device 152 and the second access device 162 may be vertical channel transistors having a floating body architecture. The apparatus 100 may be a dynamic random access memory (DRAM). In some embodiments, the first memory cell 150 and the second memory cell 160 may be based on $8F^2$, $6F^2$, $4F^2$, or other memory cell architectures. Other types of circuits may be used for the memory array 104 without departing from the scope of the present disclosure.

In operation, typically, prior to a memory access operation associated with the first memory cell 150, the DIGIT* line and the DIGIT line are each precharged to a precharge voltage. During the memory access operation, the WL1 wordline may be set to an access voltage to activate the first access device 152 to couple the first storage device 154 to the DIGIT* line. Further, a first activation voltage ACT and a second activation voltage RNL are each received at the sense amplifier circuit 110. In some embodiments, the ACT voltage may be a VH1 voltage (e.g., a VCC voltage) and the RNL voltage may be a VL1 voltage (e.g., a reference voltage or ground). Based on a logical value stored (e.g., represented by the charge, a resistance, or other property indicating a logical value stored by a particular memory architecture) by the first storage device 154, the sense amplifier circuit 110 may drive the voltage of the DIGIT* line to transition from the precharge voltage to either the ACT voltage (e.g., indicating that the charge stored by the first storage device 154 represents a logical high value) or the RNL voltage (e.g., indicating that the logical value stored by the first storage device 154 represents a logical low value). The sense amplifier circuit 110 may drive the DIGIT line from the precharge voltage to the complement of the DIGIT* line. For example, if the first storage device 154 is storing a logical high value, then the DIGIT* line will transition to the ACT voltage and the DIGIT line will transition to the RNL voltage. Further, if the first storage device 154 is storing a logical low value, then the DIGIT* line will transition to the RNL voltage and the DIGIT line will transition to the ACT voltage. Thus, based on logical value stored by the first storage device 154, one of the DIGIT* line or the DIGIT line may transition to the ACT voltage and the other may transition to the RNL voltage.

In floating body architectures, where a potential of the body of an access device (e.g., the first access device 152 or the second access device 162) or of a substrate is floating, current leakage through an access device may increase based on an operating condition of the memory array 104 while the access device is deactivated. For example, when a memory cell coupled to the DIGIT* or DIGIT line is accessed during a memory access operation, current leakage may occur through the floating body of the access devices of memory cells that are also coupled to the DIGIT* and/or DIGIT line but not accessed during the memory access operation. In some examples, the greater the voltage differential across the access device, the greater the leakage current. Since the body of the access device is floating, a capacitive effect of the high voltage differential across the access device causes a channel to form through the floating body of the access device. In the floating body architectures, a first worst case leakage current may exist when the voltage of the DIGIT*/DIGIT line is equal to the ACT voltage and the storage device is storing a logical low value. Further, a second worst case leakage current may exist when the voltage of the DIGIT*/DIGIT line is equal to the RNL voltage and the storage device is storing the logical high value. Additionally, the leakage current may continue to increase as long as the first worst case or the second worst scenario exists. This is because the floating body creates a capacitive effect and the high voltage differential continues to charge the floating body as long as the high voltage differential exists. The leakage current may be reduced by decreasing the ACT voltage and increasing the RNL voltage (e.g., to decrease a voltage differential across the access device). However, decreasing the ACT voltage or increasing the RNL voltage, respectively, may increase DIGIT*/DIGIT line transition times, which may result in access time failing to meet performance specifications.

Using the first memory cell 150 as an example, in order to reduce the leakage current for the second access device 162 of the second memory cell 160, during an initial time period of a memory access operation targeting the first memory cell 150, the first access device 152 may be activated by the WL1 wordline to couple the first storage device 154 to the DIGIT* line. Further, the sense amplifier circuit 110 may select the VH1 voltage for the ACT voltage and may select the VL1 voltage for the RNL voltage. Based on the logical value stored by the first storage device 154, the sense amplifier circuit 110 may drive one of the DIGIT* or DIGIT lines to the VH1 voltage, and may drive the other line to the VL1 voltage. After the initial time period, the sense amplifier circuit 110 may select a VH2 voltage for the ACT voltage and a VL2 voltage for the RNL voltage. The sense amplifier circuit 110 may drive the DIGIT* or DIGIT line that was previously driven to the VH1 voltage to the VH2 voltage, and the other line to the VL2 voltage. In an embodiment, VH1 is greater than VH2, and VL1 is less than VL2. Based on the logical value stored by the first storage device 154, one of the DIGIT* line or the DIGIT line may settle at a voltage equal to the VH2 voltage and the other will settle at a voltage equal to the VL2 voltage. Selecting a lower ACT voltage may reduce a leakage current for the access device 162 when the DIGIT line is at the lower ACT voltage and the second storage cell 164 is storing a low logical value. Selecting a higher RNL voltage may reduce a leakage current for the second access device 162 when the DIGIT line is at the higher RNL voltage and the second memory cell is storing a high logical value.

In some embodiments, the initial time period may be less than 50 nanoseconds. In some embodiments, the VH1 voltage may be less than or equal to 25 percent greater than the VH2 voltage. In other embodiments, the VH1 voltage may be 0.25 volts greater than the VH2 voltage, and the VL2 voltage may be 0.25 volts greater than the VL1 voltage.

In some examples, selection of the VH1 or the VH2 voltages for the ACT voltage by the sense amplifier circuit 110 may be responsive to a first set of control signals, and/or the selection of the VL1 or the VL2 voltages for the RNL voltage by the sense amplifier circuit 110 may be responsive to a second set of control signals. The memory access operation may include a read operation and/or a write operation. Sensing a logical value stored by the first storage device 154 during the read and/or write operation may occur after the initial time period. As explained above, the logical value stored at the first storage device 154 may cause the sense amplifier circuit 110 to drive one of the DIGIT* and DIGIT lines to the ACT voltage and the other to the RNL voltage. Thus, the ACT and the RNL voltages may be used to provide an indication of the logical value indicated by the logical value stored at the first storage device. Thus, the logical high value may be based on the VH2 voltage and the logical low value may be based on the VL2 voltage.

Using the higher ACT voltage and the lower RNL voltage during the initial time period may reduce the negative effect of FBE for circuits having a floating body architecture. The higher ACT voltage and the lower RNL voltage during the initial time period may provide a faster transition rate, and after the first time period, decreasing the ACT voltage and increasing the RNL voltage may reduce a leakage current through access devices of the memory cells of the memory array 104. The operation of the second memory cell 160 may be similar to the operation of the first memory cell 150, except the second access device 162 of the second memory cell 160 is coupled to the DIGIT line and the WL2 wordline and the first access device 152 of the first memory cell remains deactivated. While FIG. 1 depicts the first memory cell 150 coupled to the DIGIT* line and the second memory cell 160 coupled to the DIGIT line, the two or more memory cells may be coupled to each of the DIGIT* line and the DIGIT line. Further, while FIG. 1 depicts that the WL1 wordline coupled to the first access device 152 of the first memory cell 150 and the WL2 wordline coupled to the second access device 162 of the second memory cell 160, the memory array 104 may include additional wordlines coupled to additional access devices of additional memory cells. It will also be appreciated that memory cells coupled to the same DIGIT* line or the same DIGIT line may be coupled to a different respective wordline. It will be also be appreciated that, in some examples, only one of the ACT voltage or the RNL voltage may transition to a new value after the initial time period (e.g., the ACT voltage may remain at the VH1 voltage or the RNL voltage may remain at the VL1 voltage).

Figure 2:
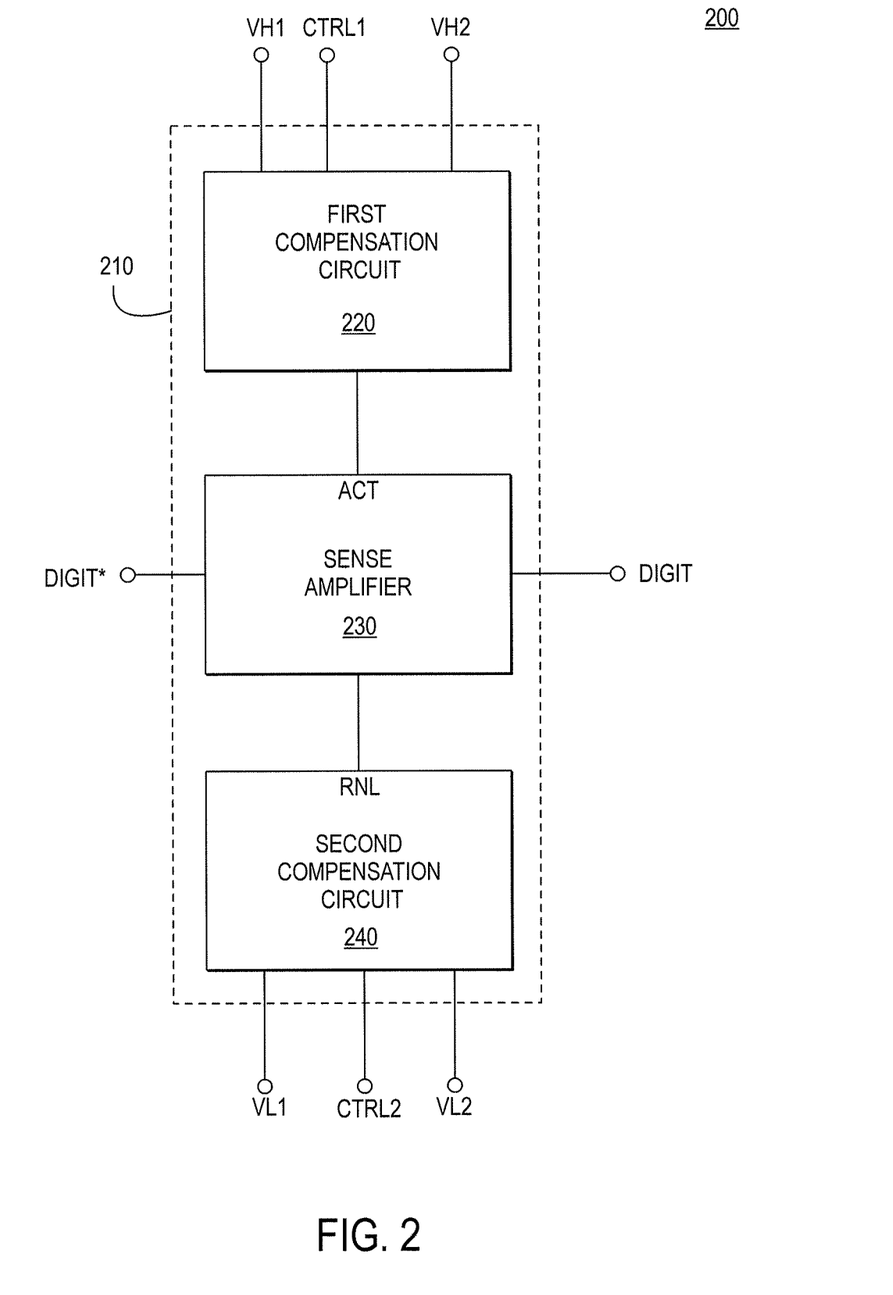
FIG. 2 is a block diagram of a particular illustrative embodiment of an apparatus including a sense amplifier circuit according to an embodiment of the disclosure.

Referring to FIG. 2, a particular illustrative embodiment of an apparatus including a sense amplifier circuit according to an embodiment of the invention is disclosed and generally designated 200. The apparatus 200 may include a sense amplifier circuit 210. The sense amplifier circuit 210 may include a sense amplifier 230. The sense amplifier 230 may be coupled to a first compensation circuit 220 to receive a first activation voltage ACT and may be coupled to a second compensation circuit 240 to receive a second activation voltage RNL. The first compensation circuit 220 may provide the ACT voltage having a selected value based on a first set of control signals CTRL1. The second compensation circuit 240 may provide the RNL voltage having a selected value based on a second set of control signals CTRL2. The sense amplifier 230 may provide sense voltages (e.g., ACT and/or RNL voltages) to a DIGIT* line and a DIGIT line during a memory access operation based on the logical value stored a target memory cell of the memory access operation that is coupled to the DIGIT* or the DIGIT line. The apparatus 200 may be a dynamic random access memory (DRAM) having vertical channel transistors having a floating body architecture. The sense amplifier circuit 210 may be used in the sense amplifier circuit 110 of FIG. 1.

In operation, as explained with reference to FIG. 1, prior to a memory access operation associated with a target memory cell, the DIGIT* line and the DIGIT line may each be precharged to a precharge voltage. During an initial time period of the memory access operation, an access device of a target memory cell (e.g., the first access device 152 of the first memory cell 150 or the second access device 162 of the second memory cell 160 of FIG. 1) may be activated based on an access voltage applied to a wordline. Further during the initial time period, the CTRL1 signals may have a first respective value and the CTRL2 signals may have a first respective value. The first compensation circuit 220 may select the VH1 voltage for the ACT voltage responsive to the CTRL1 signals having the first respective value. The second compensation circuit 240 may select the VL1 voltage for the RNL voltage responsive to the CTRL2 signals having the first respective value. Based on the logical value stored by the target memory cell, the sense amplifier circuit 210 may drive one of the DIGIT* line or the DIGIT line to the ACT voltage and may drive the other to the RNL voltage.

After the initial time period, the CTRL1 signals may have a second respective value and the CTRL2 signals may have a second respective value. The first compensation circuit 220 may select the VH2 voltage for the ACT voltage responsive to the CTRL1 signals having the second respective value. The second compensation circuit 240 may select the VL2 voltage for the RNL voltage responsive to the CTRL2 signals having the second respective value. In an embodiment, VH1 is greater than VH2 and VL1 is less than VL2. Based on the value of the logical value stored by the target memory cell, the sense amplifier circuit 210 may drive one of the DIGIT* line or the DIGIT line the VH2 voltage and may drive the other will the VL2 voltage. In some embodiments, the VH1 voltage may be less than 25 percent greater than the VH2 voltage. In other embodiments the VH1 voltage may be 0.25 volts greater than the VH2 voltage, and the VL2 voltage may be 0.25 volts greater than the VL1 voltage.

Driving the DIGIT* line and the DIGIT line based on the VH1 voltage and the VL1 voltage may provide a faster transition rate, and driving the DIGIT* line and the DIGIT line based on the VH2 voltage and the VL2 voltage may reduce a leakage current through memory cells coupled to the DIGIT* and DIGIT lines that are not accessed during the memory access operation. In some embodiments, a new voltage may be selected for only one of the ACT voltage or the RNL voltage after the initial time period (e.g., the ACT voltage may remain at the VH1 voltage or the RNL voltage may remain at the VL1 voltage).

It will be appreciated that the first compensation circuit 220 and the second compensation circuit 240 may each be coupled to more than one sense amplifier. It will also be appreciated that the apparatus 200 may include a plurality of sense amplifier circuits.

Figure 3:
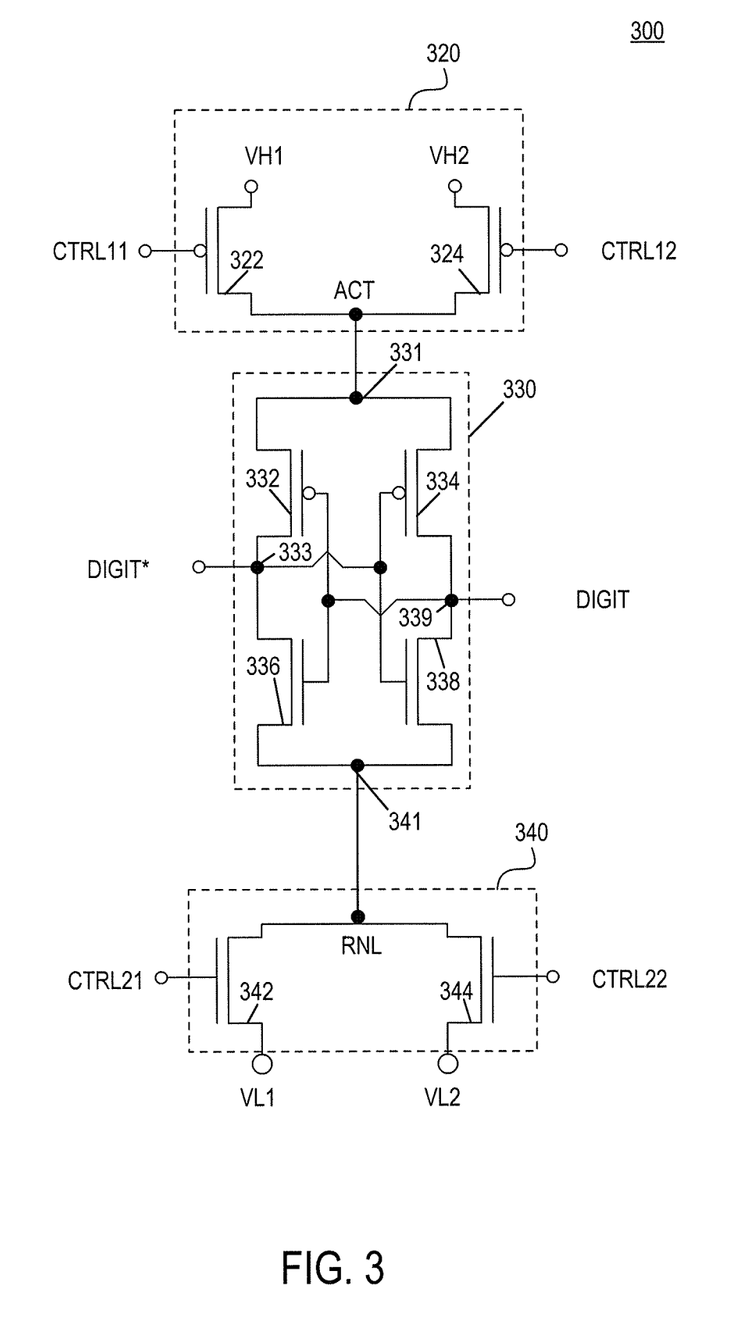
FIG. 3 is a schematic diagram of a sense amplifier circuit according to an embodiment of the disclosure.

Referring to FIG. 3, a sense amplifier circuit according to an embodiment of the invention is disclosed and generally designated sense amplifier circuit 300. The sense amplifier circuit 300 may include a sense amplifier 330. The sense amplifier 330 may be coupled to a first compensation circuit 320 to receive a first activation voltage ACT and may be coupled to a second compensation circuit 340 to receive a second activation voltage RNL. The first compensation circuit 320 may provide the ACT voltage having a selected value based on first control signals CTRL11 and CTRL12. The second compensation circuit 340 may provide the RNL voltage having a selected value based on second control signals CTRL21 and CTRL22. The sense amplifier circuit 300 may be used in the sense amplifier circuit 110 of FIG. 1 and/or the sense amplifier circuit 210 of FIG. 2.

The first compensation circuit 320 may include a first switching device 322 and a second switching device 324, with a drain of each coupled to an ACT node 331. A source of the first switching device 322 may be coupled to a VH1 source and a source of the second switching device 324 may be coupled to a VH2 source. A gate of the first switching device 322 may receive the CTRL11 signal and a gate of the second switching device 324 may receive the CTRL 12 signal. The first switching device 322 may be activated to couple the VH1 voltage to the ACT node 331 responsive to the CTRL11 signal having a first value, and may be deactivated to decouple the VH1 voltage from the ACT node 331 responsive to the CTRL 11 signal having a second value. The second switching device 324 may be activated to couple the VH2 voltage to the ACT node 331 responsive to the CTRL12 signal having a first value, and may be deactivated to decouple the VH2 voltage from the ACT node 331 responsive to the CTRL12 signal having a second value. The first switching device 322 and the second switching device 324 may be p-type transistors.

The sense amplifier 330 may include a first sensing device 332 and a third sensing device 336 coupled in series between the ACT node 331 and an RNL node 341. The sense amplifier 330 may further include a second sensing device 334 and fourth sensing device 338 coupled in series between the ACT node 331 and the RNL node 341. The DIGIT* line may be coupled to a DIGIT* node 333 between the first sensing device 332 and the third sensing device 336. The DIGIT line may be coupled to a DIGIT node 339 between the second sensing device 334 and the fourth sensing device 338. The gates of the first sensing device 332 and the third sensing device 336 may be coupled together and to the DIGIT node 339. The gates of the second sensing device 334 and the fourth sensing device 338 may be coupled together and to the DIGIT* node 333. The sense amplifier 330 may drive the DIGIT* line or the DIGIT line to complementary logical values during a memory access operation based on a logical value stored by a target memory cell.

The second compensation circuit 340 may include a third switching device 342 and a fourth switching device 344, with a drain of each coupled to the RNL node 341. A source of the third switching device 342 may be coupled to a VL1 source and a source of the fourth switching device 344 may be coupled to a VL2 source. A gate of the third switching device 342 may receive the CTRL21 signal and a gate of the fourth switching device 344 may receive the CTRL22 signal. The third switching device 342 may be activated to couple the VL1 voltage to the RNL node 341 responsive to the CTRL21 signal having a first value, and may be deactivated to decouple the VL1 voltage from the RNL node 341 responsive to the CTRL21 signal having a second value. The fourth switching device 344 may be activated to couple the VL2 voltage to the RNL node 341 responsive to the CTRL22 signal having a first value, and may be deactivated to decouple the VL2 voltage from the RNL node 341 responsive to the CTRL22 signal having a second value. The third switching device 342 and the fourth switching device 344 may be n-type transistors.

In operation, as explained with reference to FIGS. 1 and 2, prior to a memory access operation associated with a target memory cell, the DIGIT* line and the DIGIT line may be precharged to a precharge voltage. During an initial portion of the memory access operation, an access device of the target memory cell may be activated to couple the memory cell to the associated DIGIT* or DIGIT line. The first compensation circuit 320 may provide, to the ACT node 331, an initial ACT voltage equal to the VH1 voltage responsive to a value of the CTRL11 signal and the second compensation circuit 340 may provide, to the RNL node 341, an initial RNL voltage equal to the VL1 voltage responsive to a value of CTRL21 signal. After the initial time period of the memory access operation, the first compensation circuit 320 may provide, to the ACT node 331, a second ACT voltage equal to the VH2 voltage responsive to a value of the CTRL12 signal and the second compensation circuit 340 may provide, to the RNL node 341, a second RNL voltage equal to the VL2 voltage responsive to a value of the CTRL22 signal. Providing the VH1 voltage that is higher than the VH2 voltage may provide a faster transition rate when driving the DIGIT* and DIGIT lines. Thus, the sense amplifier 330 driving the DIGIT* and the DIGIT line based on the VH1 and VL1 signals may have a faster transition rate than driving the DIGIT* and DIGIT lines based on the VH2 and VL2 voltages. Selecting the VH2 and VL2 voltages for the ACT and RNL voltages, respectively, after the initial time period may reduce a leakage current through other memory cells coupled to the DIGIT* and DIGIT lines that are not accessed during the memory access operation. It will be appreciated that only one of the ACT voltage or the RNL voltage may transition to newly selected voltage after the initial time period (e.g., the ACT voltage may remain at the VH1 voltage or the RNL voltage may remain at the VL1 voltage). The CTRL11, CTRL12, CTRL21, and CTRL22 signals may be provided by a read/write circuit a command decoder, a sense amplifier controller or other control circuit.

As an example, during the initial time period of the memory access operation, the CTRL11 signal may have a first value and the CTRL12 may have a second value. Responsive to the CTRL11 signal having the first value, the first switching device 322 may be activated to provide the VH1 voltage to the ACT node 331 of the sense amplifier 330. Responsive to the CTRL12 signal having the second value, the second switching device 324 may be deactivated. Further during the initial time period, the CTRL21 signal may have a first value and the CTRL22 signal may have a second value. Responsive to the CTRL21 signal having the first value, the third switching device 342 may be activated to provide the VL1 voltage to the RNL node 341 of the sense amplifier 330. Responsive to the CTRL22 signal having the second value, the fourth switching device 344 may be deactivated.

In an example, a target memory cell (e.g., the first memory cell 150 of FIG. 1) of the memory access operation is coupled to the DIGIT* line. After the DIGIT* and DIGIT lines are precharged, the access device of the target memory cell may be activated by a wordline. A logical value stored by the target memory cell may cause the voltage of the DIGIT* line to change. Based on the change in voltage of the DIGIT* line caused by the logical value stored by the target memory cell, circuitry of the sense amplifier 330 may drive the voltage of the DIGIT* line and the voltage of the DIGIT line voltages representing complementary logical values.

For example, if the target memory cell is storing a charge indicative of a high logical value, activating the target memory cell may cause the DIGIT* line to increase above the precharge voltage. Based on the DIGIT* line increasing above the precharge voltage, the voltage of the DIGIT* node 333 may increase, which may increase a voltage at the gate of the fourth sensing device 338. Increasing the voltage at the gate of the fourth sensing device 338 may activate the fourth sensing device 338 to provide the RNL voltage to the DIGIT node 339. Providing the RNL voltage to the DIGIT node 339 may drive the DIGIT line to the RNL voltage (e.g., a logical low value). Discharging of the DIGIT node 339 toward the RNL voltage may reduce a voltage to the gate of the first sensing device 332, which may activate the first sensing device 332 to provide the ACT voltage to the DIGIT* node 333. Providing the ACT voltage to the DIGIT* node 333 may drive the DIGIT* line to the ACT voltage (e.g., a logical high value).

In another example, if the target memory cell is storing a low logical value, activating the target memory cell may cause the DIGIT* line to decrease below the precharge voltage. Based on the DIGIT* line decreasing below the precharge voltage, the voltage of the DIGIT* node 333 may decrease, which may decrease a voltage at the gate of the second sensing device 334. Decreasing the voltage at the gate of the second sensing device 334 may activate the second sensing device 334 to provide the ACT voltage to the DIGIT node 339. Providing the ACT voltage to the DIGIT node 339 may drive the DIGIT line to the ACT voltage (e.g., a logical high value). Charging of the DIGIT node 339 toward the ACT voltage may increase a voltage to the gate of the third sensing device 336, which may activate the third sensing device 336 to provide the RNL voltage to the DIGIT* node 333. Providing the RNL voltage to the DIGIT* node 333 may drive the DIGIT* line to the RNL voltage (e.g., a logical low value).

As explained above, during the initial time period of the memory access operation, the ACT voltage of the ACT node 331 may be equal to the VH1 voltage and the RNL voltage of the RNL node 341 may be equal to the VL1 voltage to drive the DIGIT* or the DIGIT line to a complementary logical values from the precharge voltage. The ACT voltage of the ACT node 331 may switch to the VH2 voltage and the RNL voltage of the RNL node 341 may switch to the VL2 voltage after the initial time period to decrease leakage current through the memory cells coupled to the DIGIT* and DIGIT lines during the memory access operation.

It will be appreciated that in some embodiments, the first compensation circuit 320 and the second compensation circuit 340 may be coupled to more than one sense amplifier.

Figure 4:
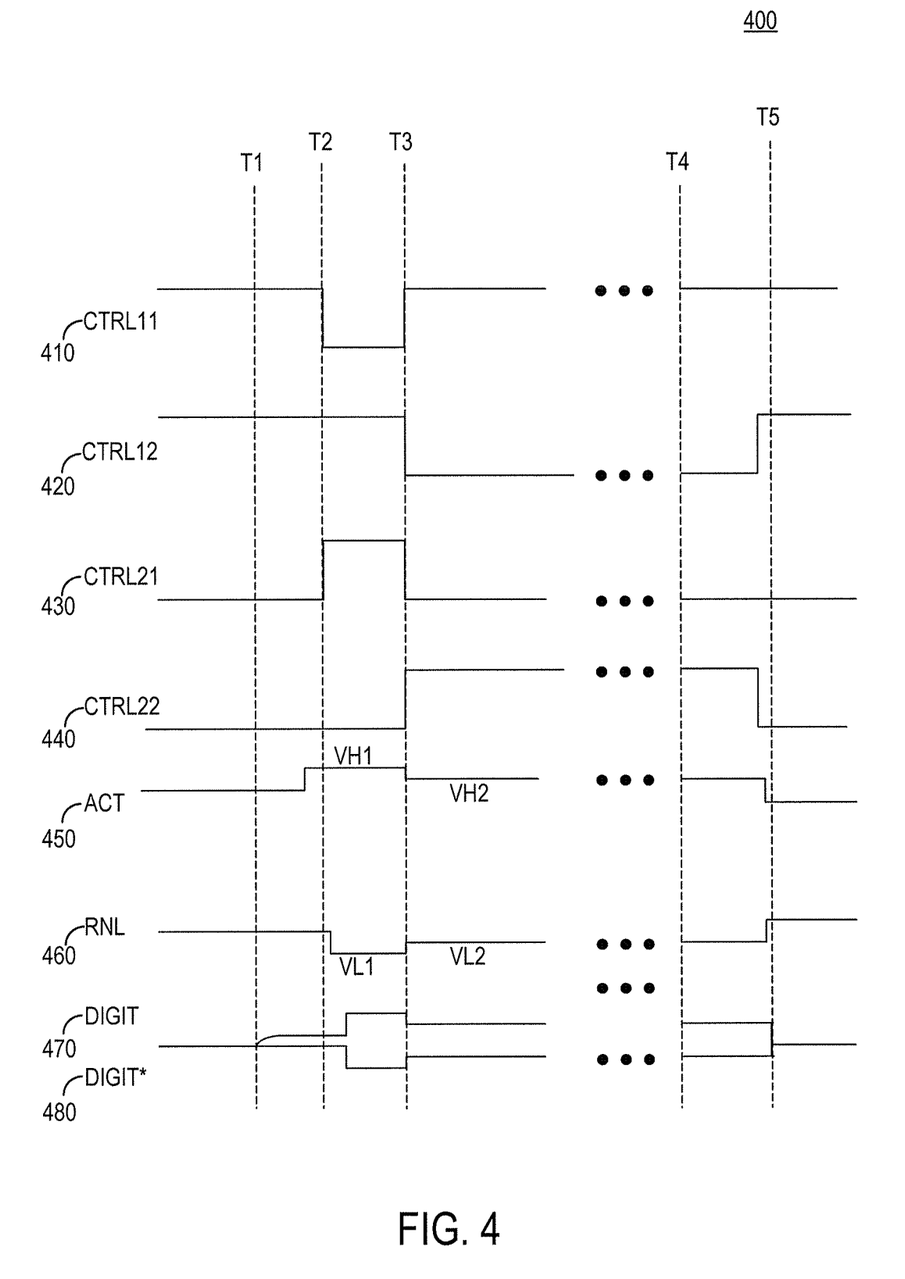
FIG. 4 is an exemplary timing diagram of various signals during operation of a sense amplifier circuit according to an embodiment of the disclosure.

Referring to FIG. 4, an exemplary timing diagram of various signals during operation of a sense amplifier circuit is disclosed and generally designated 400. For example, the exemplary timing diagram 400 illustrates timing characteristics for various signals during operation of the sense amplifier circuit 110 of FIG. 1, the sense amplifier circuit 210 of FIG. 2, and/or the sense amplifier circuit 300 of FIG. 3 according to an embodiment of the invention. The timing diagram 400 depicts exemplary timing associated with operation of a sense amplifier circuit during a memory access operation. A CTRL11 signal 410, a CTRL12 signal 420, a CTRL21 signal 430, and a CTRL22 signal 440 may correspond to the CTRL11 signal, the CTRL12 signal, the CTRL21 signal, and the CTRL22 signal, respectively, of FIG. 3. An ACT voltage 450 and a RNL voltage 460 may correspond to the ACT and RNL voltages of FIGS. 2 and 3. A DIGIT line voltage 470 and a DIGIT* line voltage 480 may correspond to voltages of the DIGIT line and DIGIT* line, respectively, of FIGS. 1-3.

The CTRL11 signal 410, the CTRL12 signal 420, the CTRL21 signal 430, and the CTRL22 signal 440 may be provided from a read/write circuit, a command decoder, a sense amplifier controller or other control circuit. Prior to time T1, the DIGIT line voltage 470 and the DIGIT* line voltage 480 may be precharged to a precharge voltage. At time T1, the access device of the target memory cell is activated, for example, by setting a wordline coupled to the access device of the target memory cell to an access voltage. Based on the access device of the target memory cell being activated, the voltage of the DIGIT line voltage 470 may increase based on the charge from the target memory cell (e.g., the increase in voltage may indicate a high logical value). At time T2, the CTRL11 signal 410 and the CTRL21 signal 430 may each transition to respective opposite logical values. Responsive to the transition of the CTRL11 signal 410, the ACT voltage 450 having a first respective value (e.g., the VH1 voltage) may be provided to the sense amplifier. Responsive to the transition of the CTRL21 signal 430, the RNL voltage 460 having a first respective value (e.g., the VL1 voltage) may be provided to the sense amplifier. Responsive to the slight increase in the voltage of the DIGIT line voltage 470, the sense amplifier may drive the DIGIT line voltage 470 to the ACT voltage 450 and may drive the DIGIT* line voltage 480 to the RNL voltage 460, as depicted between times T2 and T3.

At time T3, the CTRL12 signal 420 and the CTRL22 signal 440 may each transition to respective opposite logical values. Additionally, the CTRL11 signal 410 and the CTRL21 signal 430 may each transition to respective opposite logical values, which may decouple the first respective values of the ACT voltage 450 and RNL voltage 460 from the sense amplifier circuits. Responsive to the transition of the CTRL 12 signal 420, the ACT voltage 450 having a second respective value (e.g., the VH2 voltage) may be provided to the sense amplifier. Responsive to the transition of the CTRL22 signal 440, the RNL voltage 460 having a second respective value (e.g., the VL2 voltage) may be provided to the sense amplifier. Responsive to the change in the ACT voltage 450 and the RNL voltage 460, the sense amplifier may drive the DIGIT line voltage 470 to the second ACT voltage 450 and may drive the DIGIT* line voltage 480 to the second RNL voltage 460, respectively.

After time T3, a logical value may be read from the target memory cell based on one of the DIGIT line voltage 470 or the DIGIT* line voltage 480 voltages. A logical value may be written to the target memory as well. At time T4, after a logical value is read from or written to the target memory cell, the DIGIT line voltage 470 and DIGIT* line voltage 480 may be precharged to the precharge voltage in anticipation of a subsequent memory access.

The exemplary timing diagram 400 is a non-limiting illustration to provide a sufficient understanding of embodiments of the disclosure. Those of ordinary skill in the art will appreciate that the relative timing of the signals of the exemplary timing diagram 400 may vary from system to system. For example, relative timing of transitions of the CTRL11 signal 410, the CTRL12 signal 420, the CTRL21 signal 430 and the CTRL22 signal 440 may vary. For example, the transition of the CTRL11 signal 410 from low to high may occur after the transition of the CTRL 12 signal 420 from high to low to ensure an ACT voltage 450 is continuously provided to the sense amplifier circuit. Further, the transition of the CTRL21 signal 430 from high to low may occur after the transition of the CTRL22 signal 440 from low to high to ensure an RNL voltage 460 is continuously provided to the sense amplifier circuit.

Figure 5:
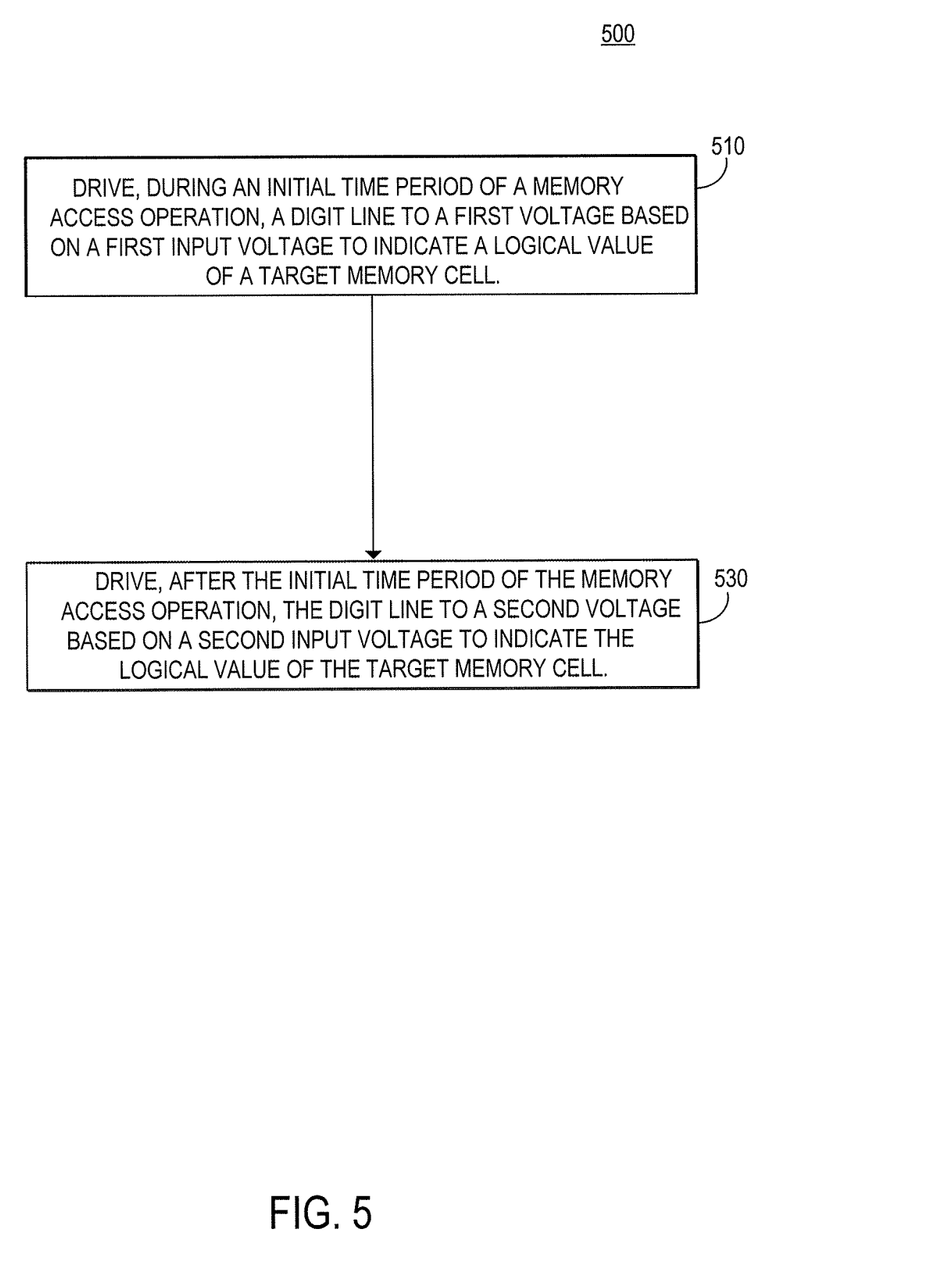
FIG. 5 is a flow diagram of operation of a sense amplifier circuit according to an embodiment of the disclosure.

FIG. 5 is a flow diagram of a method 500 of operation of a sense amplifier circuit according to an embodiment of the disclosure. The method 500 illustrated by the flowchart may be implemented by the sense amplifier circuit 110 of FIG. 1, the sense amplifier circuit 210 of FIG. 2, and/or the sense amplifier circuit 300 of FIG. 3.

The method 500 may include driving, during an initial time period of a memory access operation, a digit line to a first voltage that indicates a logical value of a target memory cell of the memory access operation, at 510. The first voltage may be based on a first input voltage. The method 500 may further include precharging the digit line to a precharge voltage prior to the memory access operation. The target memory cell may include the first memory cell 150 or the second memory cell 160 of FIG. 1. The digit line may include the DIGIT* line and/or the DIGIT line of FIGS. 1-3. Driving the voltage of the digit line may be performed by the sense amplifier circuit 110 of FIG. 1, the sense amplifier circuit 210 of FIG. 2, and/or the sense amplifier circuit 300 of FIG. 3. The method 500 may further include receiving the first input voltage during the initial time period of the memory access operation. The method 500 may further include selecting the first input voltage responsive to a first control signal. Selecting the first input voltage may be performed by the first compensation circuit 220 and/or the second compensation circuit 240 of FIG. 2 and/or the first compensation circuit 320 and/or the second compensation circuit 340 of FIG. 3.

The method 500 may further include driving, after the initial time period of a memory access operation, the digit line to a second voltage that indicates the logical value of the target memory cell, at 530. The second voltage may be based on a second input voltage. The method 500 may further include receiving the second input voltage after the initial time period of the memory access operation. In an embodiment, the method 500 may include selecting the second input voltage responsive to a second control signal. Selecting the second input voltage may be performed by the first compensation circuit 220 and/or the second compensation circuit 240 of FIG. 2 and/or the first compensation circuit 320 and/or the second compensation circuit 340 of FIG. 3.

Figure 6:
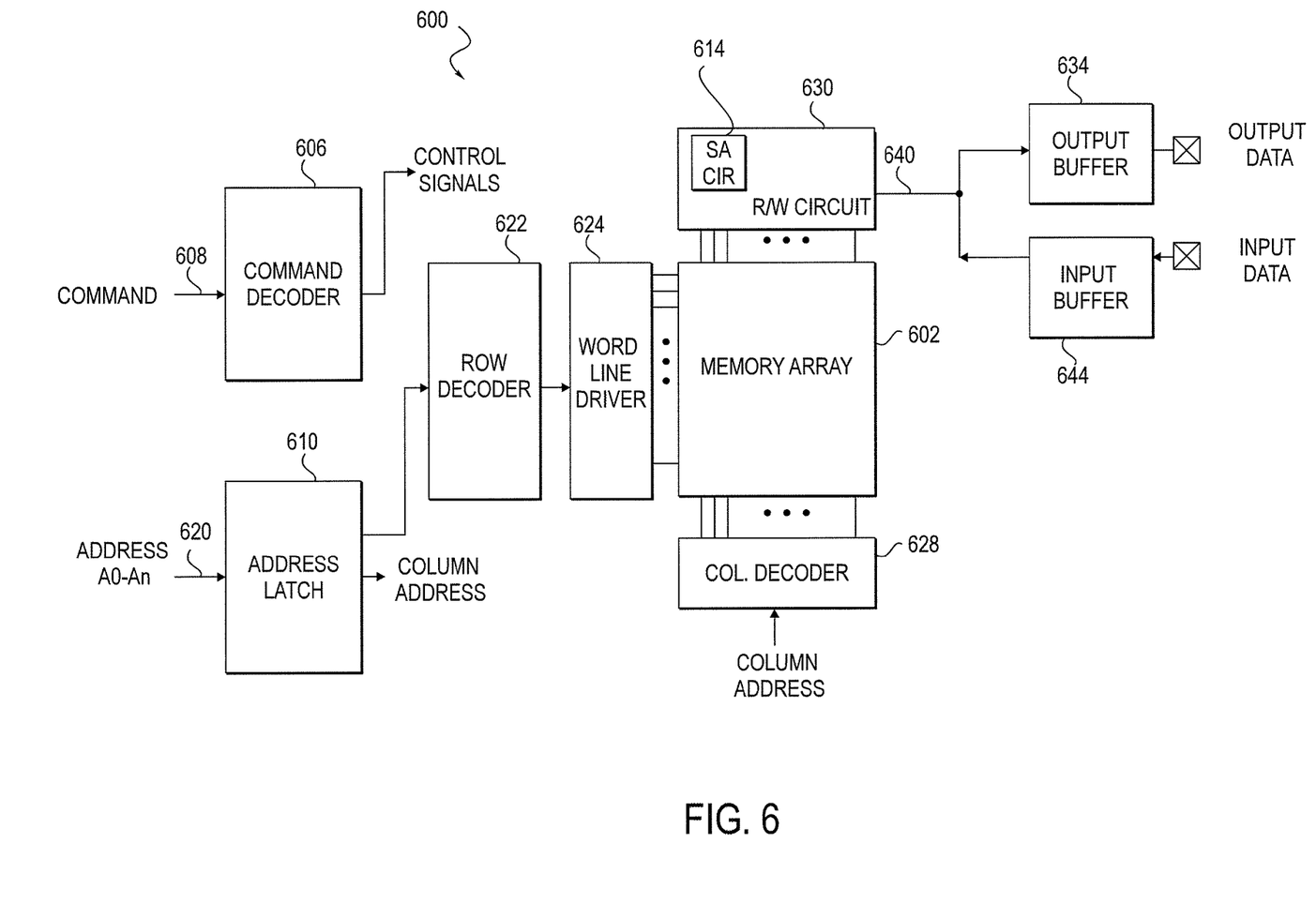
FIG. 6 is a block diagram of a memory including a sense amplifier circuit according to an embodiment of the disclosure.

The method 500 may further include driving, during the memory access operation, a second digit line to a third voltage that indicates a complementary logical value of a target memory cell of the memory access operation. Driving the voltage of the second digit line may be performed by the sense amplifier circuit 110 of FIG. 1, the sense amplifier circuit 210 of FIG. 2, and/or the sense amplifier circuit 300 of FIG. 3. In some embodiments, the method 500 may include driving, during the initial time period of the memory access operation, the second digit line to a third voltage that indicates a complementary logical value of a target memory cell of the memory access operation. The third voltage may be based on a third input voltage. Further, the method 500 may include driving, after the initial time period of a memory access operation, the second digit line to a fourth voltage that indicates the complementary logical value of the target memory cell. The fourth voltage may be based on a fourth input voltage FIG. 6 illustrates a portion of a memory 600 according to an embodiment of the present disclosure. The memory 600 includes a memory array 602 of memory cells, which may be, for example, DRAM memory cells, SRAM memory cells, flash memory cells, phase change memory cells, or some other types of memory cells. The memory 600 includes a command decoder 606 that receives memory commands through a command bus 608 and generates corresponding control signals within the memory 600 to carry out various memory operations. Row and column address signals are applied to the memory 600 through an address bus 620 and provided to an address latch 610. The address latch then outputs a separate column address and a separate row address.

The row and column addresses are provided by the address latch 610 to a row decoder 622 and a column address decoder 628, respectively. The column address decoder 628 selects bit lines extending through the array 602 corresponding to respective column addresses. The row decoder 622 is connected to wordline driver 624 that activates respective rows of memory cells in the memory array 602 corresponding to received row addresses. The selected digit line (e.g., a bit line or bit lines) corresponding to a received column address are coupled to a read/write circuit 630 to provide read data to a data output circuit 634 via an input-output data bus 640. An output pad coupled to the data output circuit 634 is used for electrically coupling to the memory 600. Write data are applied to the memory array 602 through a data input circuit 644 and the memory array read/write circuitry 630. In some embodiments, the read/write circuitry may include a sense amplifier circuit 614 to facilitate reading data from and writing data to the memory array 602. The sense amplifier circuit may include the sense amplifier circuit 110 of FIG. 1, the sense amplifier circuit 210 of FIG. 2, and/or the sense amplifier circuit 300 of FIG. 3, and/or may be configured to perform the method 500 of FIG. 5. An input pad coupled to the data input circuit 644 is used for electrically coupling to the memory 600. The command decoder 606 responds to memory commands applied to the command bus 608 to perform various operations on the memory array 602. In particular, the command decoder 606 is used to generate internal control signals to read data from and write data to the memory array 602.

Various illustrative components, blocks, configurations, modules, circuits, and steps have been described above generally in terms of their functionality. Skilled artisans may implement the described functionality in varying ways for each particular application, but such implementation decisions should not be interpreted as causing a departure from the scope of the present disclosure.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as previously described.

What is claimed is:

1. An apparatus comprising:
    a memory including a memory cell, the memory including circuits having a floating body architecture; and
    a sense amplifier circuit configured to be coupled to a digit line and configured to, during a memory access operation, drive the digit line to a voltage that indicates the logical value stored by a memory cell coupled to the digit line, wherein, during an initial time period of the memory access operation, the sense amplifier circuit is configured to drive the digit line to a first voltage that indicates the logical value stored by the memory cell, and wherein, after the initial time period, the sense amplifier circuit is configured to drive the digit line to a second voltage different than the first voltage that indicates the logical value stored by the memory cell.

2. The apparatus of claim 1, wherein the sense amplifier circuit comprises a compensation circuit configured to select a first input voltage to be provided as the first voltage during the initial time period, and wherein the compensation circuit is further configured to select a second input voltage to be provided as the second voltage after the initial time period.

3. The apparatus of claim 2, wherein the compensation circuit comprises:
    a first switching device configured to provide the first input voltage responsive to a first control signal having a first logic level; and
    a second switching device configured to provide the second input voltage responsive to the first control signal having a second logic level.

4. The apparatus of claim 3, wherein the first switching device and the second switching device are each transistors.

5. The apparatus of claim 1, wherein the first input voltage is greater than the second input voltage.

6. The apparatus of claim 1, wherein the first input voltage is less than the second input voltage.

7. The apparatus of claim 1, wherein the sense amplifier circuit is further configured to be coupled to a second digit line, wherein the sense amplifier circuit is further configured to, during the memory access operation, drive the second digit line to a voltage that indicates a logical value complementary to the logical value indicated by a voltage of the first digit line.

8. The apparatus of claim 1, wherein the sense amplifier circuit is further configured to be coupled to a second digit line, and wherein, during an initial time period of the memory access operation, the sense amplifier circuit is configured to drive the second digit line to a third voltage that indicates the logical value complementary to the logical value indicated by a voltage of the first digit line, and wherein, after the initial time period, the sense amplifier circuit is further configured to drive the second digit line to a fourth voltage that indicates the logical value complementary to the logical value indicated by a voltage of the first digit line.

9. The apparatus of claim 1, wherein an access device of the memory cell has a floating body architecture.

10. The apparatus of claim 1, wherein the access device of the memory cell comprises a vertical channel transistor.

11. A method, comprising:
    driving, during an initial time period of a memory access operation, a digit line to a first voltage that indicates a logical value of a target memory cell of a memory, the memory including circuits having a floating body architecture; and
    driving, after the initial time period of a memory access operation, the digit line to a second voltage that indicates the logical value of the target memory cell, wherein the second voltage is different than the first voltage.

12. The method of claim 11, further comprising:
    receiving a first input voltage during the initial time period of the memory access operation to be provided as the first voltage; and
    receiving a second input voltage after the initial time period of the memory access operation to be provided as the second voltage.

13. The method of claim 11, further comprising:
    selecting a first input voltage responsive to a first control signal to be provided as the first voltage; and
    selecting a second input voltage responsive to a second control signal to be provided as the second voltage.

14. The method of claim 11, further comprising driving, during the memory access operation, a second digit line to a third voltage that indicates a complementary logical value of the target memory cell of the memory access operation.

15. The method of claim 11, further comprising:
driving, during the initial time period of the memory access operation, a second digit line to a third voltage that indicates a complementary logical value of the target memory cell; and
driving, after the initial time period of a memory access operation, the second digit line to a fourth voltage that indicates the complementary logical value of the target memory cell, wherein the fourth voltage is different than the third voltage.

16. The method of claim 11, further comprising precharging the digit line to a precharge voltage prior to the memory access operation.

* * * * *